United States Patent [19]
Lim

[11] Patent Number: 5,164,815
[45] Date of Patent: Nov. 17, 1992

[54] INTEGRATED CIRCUIT DEVICE AND METHOD TO PREVENT CRACKING DURING SURFACE MOUNT

[75] Inventor: Thiam B. Lim, Pasir Ris Gardens, Singapore

[73] Assignee: Texas Instruments Incorporated, Dallas, Tex.

[21] Appl. No.: 730,381

[22] Filed: Jul. 15, 1991

Related U.S. Application Data

[63] Continuation of Ser. No. 455,105, Dec. 22, 1989, abandoned.

[51] Int. Cl.⁵ .............................................. H01L 23/48
[52] U.S. Cl. .................................... 257/666; 257/787; 257/618
[58] Field of Search ................................ 357/70, 74

[56] References Cited

U.S. PATENT DOCUMENTS 4,003,073 1/1977 Helda et al. .................. 357/70
4,916,519 4/1990 Ward .......................... 357/70

FOREIGN PATENT DOCUMENTS 179554 8/1963 Japan.

OTHER PUBLICATIONS

I. Fukuzawa, et al., "Moisture Resistance Degradation of Plastic LSIs by Reflow Soldering", 1985 IEEE-/IRPS, pp. 192-197.

Primary Examiner—Eugene R. LaRoche
Assistant Examiner—R. Ratliff
Attorney, Agent, or Firm—Robby T. Holland; René E. Grossman; Richard L. Doanldson

[57] ABSTRACT

A semiconductor package device is disclosed. In one embodiment, attached by its active face to a lead-on-chip leadframe having leadfingers is an integrated circuit. The integrated circuit has a roughened backside. An encapsulating material surrounds the integrated circuit and the lead-on-chip leadframe so that the leadfingers are exposed. The roughened backside surface helps to reduce package cracking arising from mounting the device to a printed circuit board by reflow solder.

7 Claims, 5 Drawing Sheets

INTEGRATED CIRCUIT DEVICE AND METHOD TO PREVENT CRACKING DURING SURFACE MOUNT

This application is a continuation of application Ser. No. 07/455,105, filed Dec. 22, 1989, now abandoned.

FIELD OF THE INVENTION

This invention is related to semiconductor integrated circuit (IC) devices, and more particularly to an IC device without a chip support pad.

BACKGROUND OF THE INVENTION

An integrated circuit package generally includes an integrated circuit having an active face lying on a chip support pad connected to a leadframe and encapsulated by a substance, such as plastic, to protect the IC. The IC package is typically mounted to a printed circuit board. Reflow solder is one technique used to surface mount the IC package to a printed circuit board.

As the industry moves towards thinner (50 mils or thinner, for example) packages or larger chip sizes for higher volumetric packaging on printed circuit boards, however, new packaging techniques are evolving. Two such techniques are the lead-on-chip technique and the chip-on-lead technique. In both the lead-on-chip technique and the chip-on-lead technique, a chip support pad is not used. A thinner package or one with a larger chip size results. However, a problem occurs when surface mounting a lead-on-chip device and a chip-on-lead device to a printed circuit board by reflow solder. The heat generated during reflow solder can enhance the state of thermal mismatch between the dissimilar materials in the IC package creating high stresses in the encapsulating material. Additionally, at reflow temperature (typically about 215° C. to 260° C.) any moisture that has been absorbed by the encapsulating material is converted to steam. The steam pressure can be such that it delaminates the surface of the IC and the surface of the encapsulating material. The loss of adhesion under such conditions causes a high stress concentration in the encapsulant at the corner of the IC. This often leads to package cracking. As the area of the IC increases, cracking of the IC package in lead-on-chip and chip-on-lead devices resulting from reflow solder increases.

It is an object of this invention to provide a semiconductor integrated circuit that reduces cracking in a lead-on-chip and a chip-on lead package.

It is a further object of this invention to provide a lead-on-chip and a chip-on lead IC package that is resistant to cracking.

A further object of this invention is to provide a method of reducing cracking in a lead-on-chip and a chip-on-lead IC package.

Other objects and benefits of this invention will be apparent to those skilled in the art, based upon the description to follow herein.

SUMMARY OF THE INVENTION

A semiconductor package device is disclosed. In one embodiment, attached by its active face to a lead-on-chip leadframe having leadfingers is an integrated circuit. The integrated circuit has a roughened backside. An encapsulating material surrounds the integrated circuit and the lead-on-chip leadframe so that the leadfingers are exposed. The roughened backside surface on the integrated circuit helps to reduce package cracking arising from mounting the device to a printed circuit board by reflow solder.

DETAILED DESCRIPTION OF SPECIFIC EMBODIMENT

Figure 1:
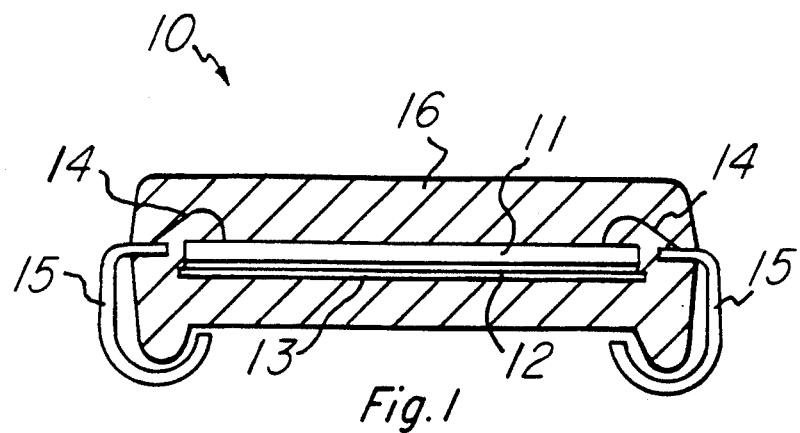
FIG. 1 is a cross section view of a typical IC package.

FIG. 1 is a cross section view of a typical IC package device 10. IC package device 10 is illustrated in the conventional plastic small outline J-leaded (PSOJ) surface mount package. A semiconductor circuit (chip) 11 is positioned on a mount support pad (chip attach) 12 lying on a leadframe 13. Wirebonds 14 are connected near the outer edges of semiconductor 11 bonding semiconductor chip 11 to leadfingers 15. An encapsulating material 16, plastic for example, surrounds semiconductor chip 11, chip attach 12, leadframe 13, wirebonds 14, and parts of leadfingers 15 so that IC package device 10 of FIG. 1 can be surface mounted to a printed circuit board, not shown. A reflow solder process wherein IC package device 10 is subjected to temperatures ranging from about 215° C. to 260° C. is typically used to surface mount IC package device 10 to the printed circuit board.

Figure 2A:
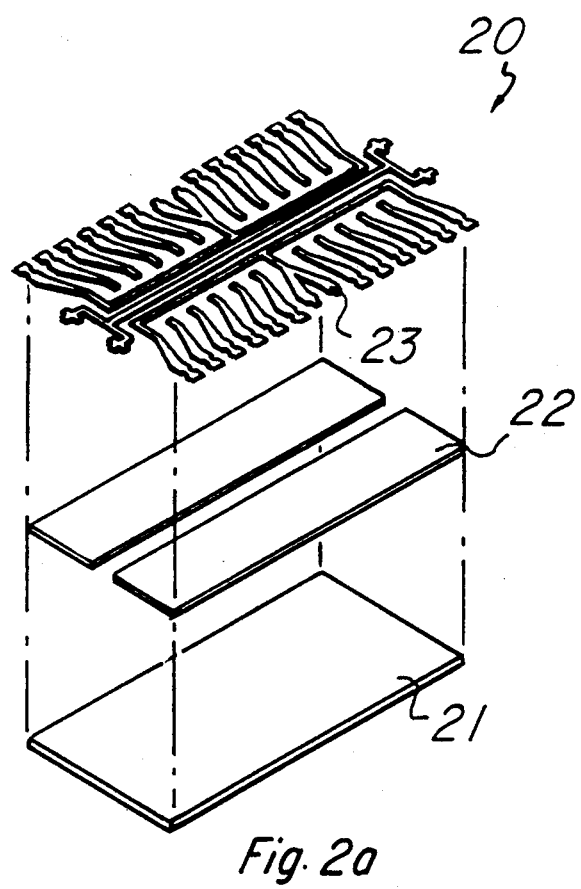
FIG. 2a is an exploded perspective view of a lead-on-chip device without an encapsulating material.

FIG. 2a is an exploded perspective view of a lead-on-chip device 20 without an encapsulating material. A semiconductor circuit (chip) 21 is positioned below a lead-on-chip leadframe 23. A tape 22 lying between lead-on-chip leadframe 23 and semiconductor chip 21 helps to position and bond semiconductor chip 21 to lead-on-chip leadframe 23. A chip support pad is not used.

Figure 2B:
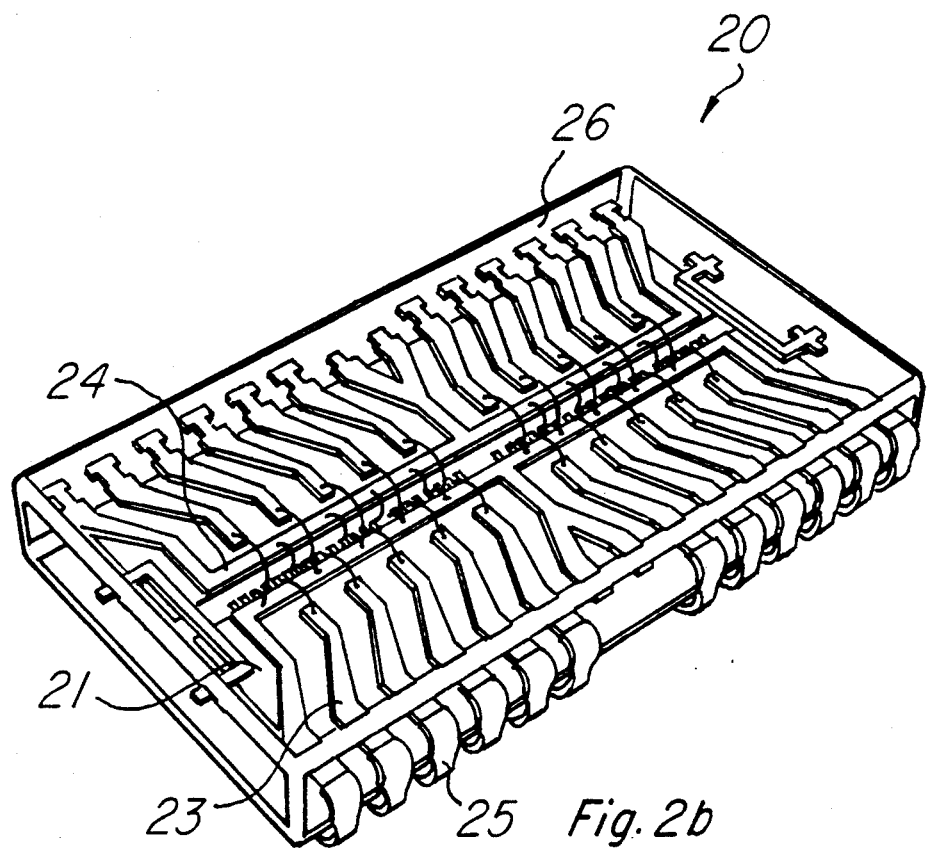
FIG. 2b is a view of a lead-on-chip package wherein the encapsulating material is rendered transparent.

FIG. 2b is a view of lead-on-chip device 20 wherein an encapsulating material 26 is transparent. Wirebonds 24 are connected near the center of semiconductor chip 21 bonding semiconductor chip 21 to lead-on-chip leadframe 23. The leadfingers 25 of lead-on-chip leadframe 23 are curved in the "J" shape as in FIG. 1, however, leadfingers 25 of lead-on-chip leadframe 23 are an integral part of lead-on-chip leadframe 23.

Figure 2C:
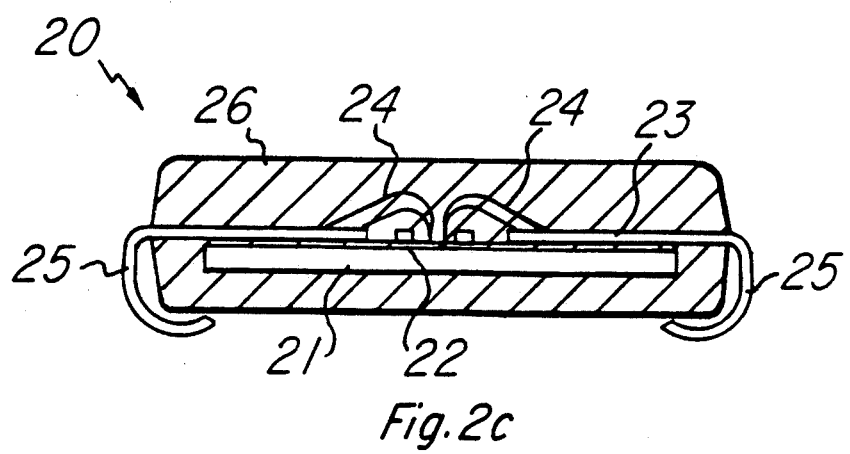
FIG. 2c is a cross section view of the lead-on-chip package of FIG. 2b.

FIG. 2c is a cross section view of lead-on chip package device 20. Leadfingers 25 are clearly shown as an integral part of lead-on-chip leadframe 23. Wirebonds 24 are clearly illustrated near the center of semiconductor chip 21 and lead-on-chip leadframe 23. An encapsulating material 26, plastic for example, surrounds semiconductor chip 21, tape 22, lead-on-chip leadframe 23, wirebonds 24, and parts of leadfingers 25 so that lead-on-chip package device 20 can be mounted to a printed circuit board, not shown. A reflow solder process wherein lead-on-chip package device 20 is subjected to temperatures ranging from about 215° C. to 260° C. is typically used to surface mount lead-on-chip package device 20 to the printed circuit board.

Figure 3:
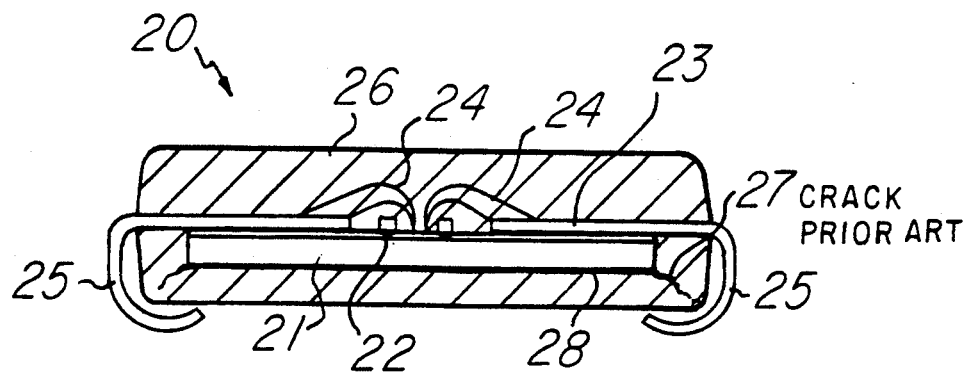
FIG 3 is a cross section view of the lead-on-chip package of FIG. 2b illustrating a crack in the encapsulating material.

FIG. 3 is a cross section view of lead-on-chip package device 20 illustrating a crack 27 in encapsulating material 26. With the temperatures lead-on-chip package device 20 is subjected to during reflow solder, an enhanced state of thermal mismatch occurs between the dissimilar materials in the package creating high stresses. Moisture in lead-on-chip package device 10 is converted into steam during reflow solder. The ensuing steam pressure causes delamination (illustrated as space 28) between the inactive face of silicon chip 21 and encapsulating material 26. The loss of adhesion under such conditions creates a high stress concentration in the encapsulating material 26 at the corner of chip 21 and causes crack 27.

Figure 4:
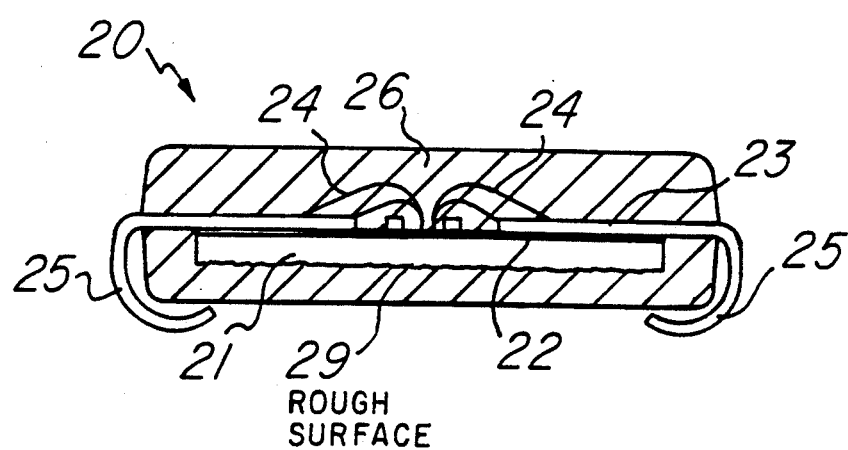
FIG. 4 is a cross section view of a lead-on-chip package illustrating a roughened surface on the inactive face of the semiconductor chip.

FIG. 4 is a cross section view of lead-on-chip package device 20 illustrating the embodiment of the invention wherein the inactive surface of silicon chip 21 is roughened, numeral 29. Roughing the backside surface of silicon chip 21 improves the adhesion between silicon chip 21 and encapsulating material 26. The presence of roughened surface 29 forms a very strong bond between the inactive backside face of silicon chip 21 and encapsulating material 26. It also reduces the tendency of silicon chip 21 to pick up surface contaminants since contact with contaminants is likely to be limited only to the peaks of the irregularities of roughened surface 29. In preventing delamination, the presence of roughened surface 29 also avoids stress concentration in encapsulating material 26 at the corners of silicon chip 21 thus preventing cracking. Roughing the backside of silicon chip 21 may occur as part of the "front end" process (i.e., before the silicon wafer is cut into individual silicon chips) by backgrinding the silicon wafer.

Figure 5:
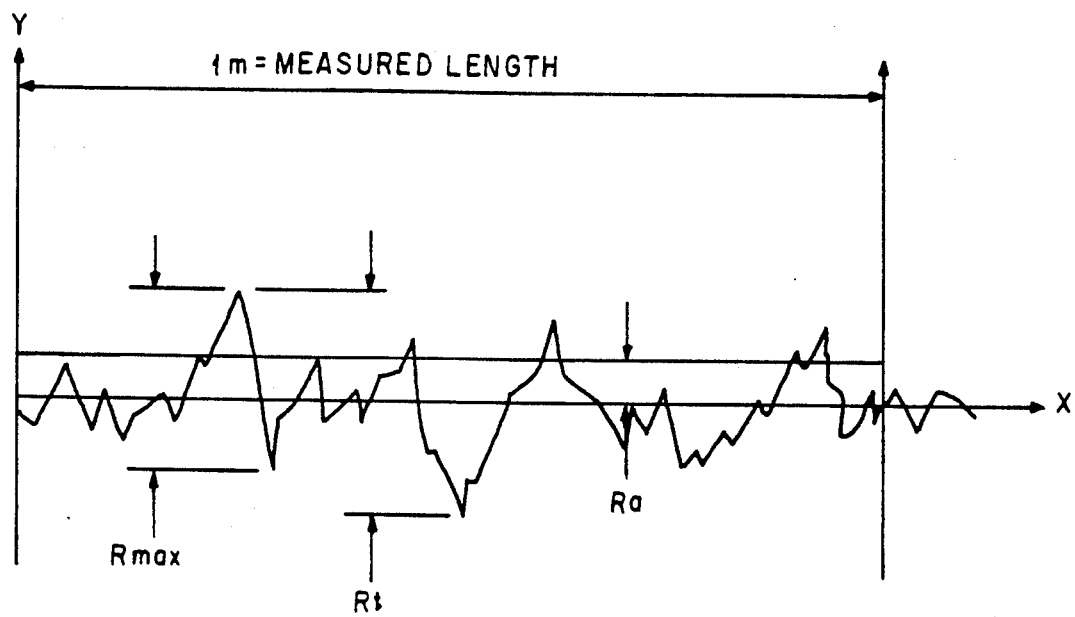
FIG. 5 is a graph illustrating the roughened backside surface parameter finish for silicon chip 21.

FIG. 5 is a graph illustrating the roughened backside surface parameter finish for silicon chip 21. Rt represents the distance between the highest peak and the lowest valley along the measured length. Rmax is the maximum individual peak to valley distance along the measured length. The Ra surface finish parameter is defined as the arithmetic mean surface roughness measured along a sampling length and is the mean deviation from an imaginary line such that the areas bounded by the surface irregularities are equal above and below this imaginary line. While Ra may be wide ranging and other values are acceptable that reduce package cracking, a silicon chip roughness in the range of about 8 to 14 microinch Ra significantly improves adhesion of the backside of silicon chip 21 to encapsulating material 26.

Test results confirm that roughing the backside of silicon chip 21 significantly reduces package cracking. Two test were used to simulate surface mounting IC packages that have moisture in them. Two different types of IC packages were used: A lead-on-chip package device as in FIGS. 2a–2c; and a lead-on-chip package device as in FIG. 4 wherein the inactive backside of silicon chip 21 has a roughened surface. The IC packages were 400 mils "PSOJ" type. Moisture was introduced into the IC packages followed by a reflow solder process. Test 1 subjected the packages to an autoclave test (atmospheric pressure of 2, temperature of 121° C., and relative humidity of 100% for 24 hours) followed by a reflow solder process. Test 2 subjected the packages to a 85° C./85%RH for 168 hours. The same reflow solder process was used on the IC packages subjected to test 1 and the IC packages subjected to test 2.

Table 1 illustrates package cracking dependency on chip size using conventional lead-on-chip packages as in FIGS. 2a–2c. The silicon chips in table 1 were subjected to test 2. Table 2 illustrates the significant improvement gained in reducing package cracking through the addition of roughened surface 29.

TABLE 1

| Chip size (×E-3 inch) | Pkg crack/ sample size | Chip size (×E-3 inch) | Pkg crack/sample size |
| --- | --- | --- | --- |
| 320 × 660 | 0/20 | 340 × 660 | 18/20 |
| 320 × 670 | 0/20 | 340 × 670 | 16/20 |
| 320 × 680 | 1/20 | 340 × 680 | 18/20 |
| 320 × 690 | 3/20 | 340 × 690 | 17/20 |
| 330 × 660 | 9/18 | 350 × 660 | 17/20 |
| 330 × 670 | 7/18 | 350 × 670 | 20/20 |
| 330 × 680 | 12/18 | 350 × 680 | 20/20 |
| 330 × 690 | 7/24 | 350 × 690 | 19/20 |

TABLE 2

| Chip size (×E-3 inch) | Test 1 85 Pkg crack/sample size | | Test 2 pv Pkg crack/sample size | |
| --- | --- | --- | --- | --- |
| | Conventional | New | Conventional | New |
| 330 × 660 | 43/172 | 0/127 | — | — |
| 340 × 660 | 255/320 | 0/53 | 119/164 | 0/50 |
| 344 × 682 | 7/24 | 0/13 | — | 0/50 |
| 344 × 695 | 12/24 | 0/13 | — | 0/50 |

The results in Table 1 reveal the susceptibility of the lead-on-chip package device 20 without the roughened surface 29 to crack. For a combination of 16 silicon chip sizes subjected to such a surface mount stress simulation, only the 2 smaller sizes did not have package cracking. Repeated experiments showed that the addition of roughened surface 29 eliminated package cracking. A comparison between the resilience of the lead-on-chip package device of FIGS. 2a–2c without roughened surface 29 and lead-n-chip package device of FIG. 4 with roughened surface 29 is illustrated in Table 2. Under test 1, with a silicon chip 21 size of 0.330×0.660 inches, 43 out of 172 samples without roughened surface 29 cracked whereas 0 out of 127 samples with roughened surface 29 cracked. Under test 1, with a larger silicon chip size of 0.344×0.695 inches, 12 out of 24 samples without roughened surface 29 cracked whereas 0 out of 13 samples with roughened surface 29 cracked. Under test 2, with a silicon chip size of 0.340×0.660 inches, 119 out of 164 samples without roughened surface 29 cracked whereas 0 out of 50 with roughened surface 29 cracked.

Figure 6:
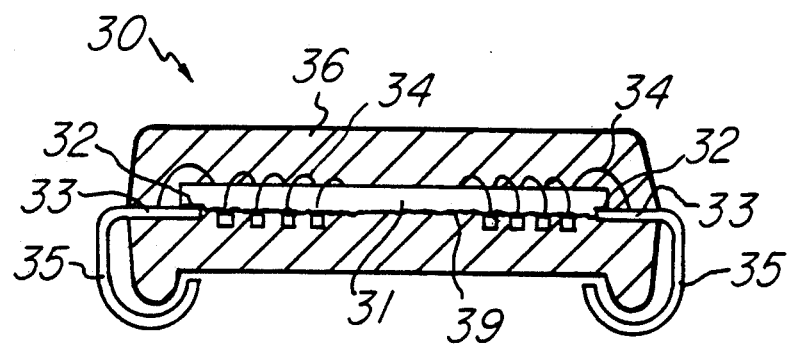
FIG. 6 is a cross section view of a lead-on-chip package illustrating a roughened surface on the inactive face of the semiconductor chip.

In another embodiment, silicon chip 21 having a roughened backside may be used with a chip-on-lead leadframe to form a chip-on-lead package device as illustrated in FIG. 6. No surface mount pad is used in this package device. The silicon chip resides over the chip-on-lead leadframe. A tape between the silicon chip and the chip-on-lead lead frame helps to position and bond the silicon chip to the chip-on-leadframe. The active face of the silicon chip is bonded to the chip-on-lead leadframe. The active face of the silicon chip also points towards the top of the package.

Figure 7:
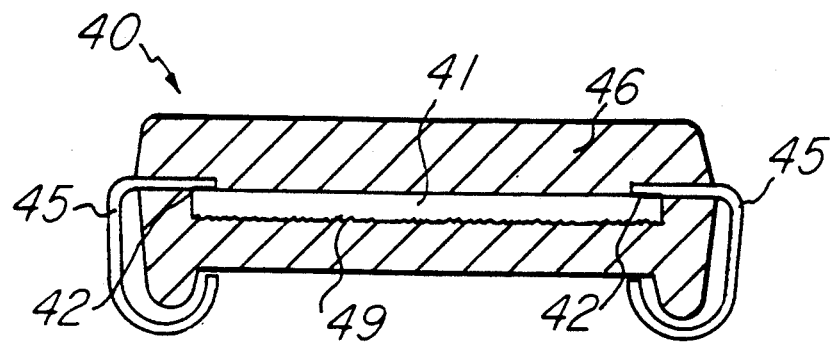
FIG. 7 is a cross section view of a tabpak package illustrating a roughened surface on the inactive face of the semiconductor chip.

FIG. 7 is a cross section view of a tabpak package device wherein silicon chip 41 has a roughened backside. In the tabpak package, a chip support pad is not used. Neither are wirebonds used. The leadfingers 45 extend to above the bonding pads of silicon chip 41. The bonding pads are bonded by fusion to the leadfingers. A very thin package results. As in the lead-on-chip package device and the chip-on-lead package device, the roughened backside surface 49 provides strong adhesion in the tabpak package and reduces package cracking.

Figure 8:
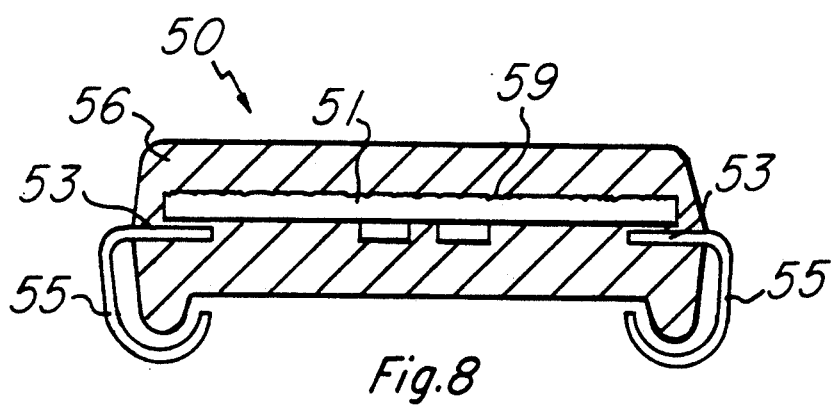
FIG. 8 is a cross section view of a flip-chip package illustrating a roughened surface on the inactive face of the semiconductor chip.

FIG. 8 is a cross section view wherein a flip-chip package device 50 has a silicon chip 51 having a roughened inactive backside surface 59. In the flip-chip package, a tape is not used, wirebonds are not used, and a chip mount pad is not used. The silicon chip is "flipped" so that its inactive backside points to the top. The leadfingers extend below bonding pads on the active face and are bonded by fusion.

Besides significantly reducing package cracking, the addition of roughened surface 29 to the inactive backside of silicon chip 21 yields other advantages. There is no need for "drying", by backing, or the IC packages before surface mounting in order to avoid package cracking. There is no need for "dry packing" (baking of the IC packages followed by placing then in hermetic bags) for shipment to customers. There is no need for extra processes to enhance adhesion between the silicon chip and the plastic encapsulant because the desired backside chip roughness can be obtained from the silicon wafer backgrinding process.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. A semiconductor device, comprising:

an integrated circuit having an active face and an inactive backside;

a leadframe connected to the active face of the integrated circuit by wirebonds, the integrated circuit and the leadframe forming a self supporting structure;

an encapsulant to encapsulate the integrated circuit and the leadframe; and wherein the backside of the integrated circuit has a roughened surface to promote adhesion to the encapsulant.

2. The semiconductor device of claim 1 wherein the lead frame is a lead-on-chip lead frame.

3. The semiconductor device of claim 1 wherein the lead frame is a chip-on-lead leadframe.

4. The semiconductor device of claim 1 wherein the lead frame is a flip-chip lead frame.

5. A semiconductor packaged device having no chip support pad, comprising:

a leadframe and a semiconductor die connected together to form a self supporting structure having no chip support pad and having wire bonds connecting leadfingers of the leadframe to terminals on the semiconductor die;

a plastic mold compound to encapsulate the leadframe and the semiconductor die, thereby forming a packaged device; and wherein the semiconductor die has a roughened surface to promote adhesion between the semiconductor die and the plastic mold compound.

6. The semiconductor packaged device of claim 5 wherein the semiconductor die has two major faces, one active face in contact with the leadframe by virtue of the wire bonds and one inactive face in contact with the plastic mold compound; and wherein the inactive face in contact with the plastic mold compound has the roughened surface.

7. The semiconductor packaged device of claim 6 wherein the roughened surface ranges from about 8 to 14 microinch Ra.

\* \* \* \* \*